United States Patent
Lee et al.

(10) Patent No.: US 12,398,166 B2
(45) Date of Patent: Aug. 26, 2025

(54) METHOD OF SELECTIVELY FORMING COBALT METAL LAYER BY USING COBALT COMPOUND, AND METHOD OF FABRICATING SEMICONDUCTOR DEVICE BY USING COBALT COMPOUND

(71) Applicant: SAMSUNG ELECTRONICS CO., LTD., Suwon-si (KR)

(72) Inventors: Soyoung Lee, Suwon-si (KR); Hiroshi Nihei, Ube (JP); Masashi Shirai, Ube (JP); Jaesoon Lim, Seoul (KR); Younjoung Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/139,053

(22) Filed: Apr. 25, 2023

(65) Prior Publication Data

US 2023/0257409 A1    Aug. 17, 2023

Related U.S. Application Data

(63) Continuation of application No. 16/872,504, filed on May 12, 2020, now abandoned.

(30) Foreign Application Priority Data

Jul. 31, 2019    (KR) .................. 10-2019-0093360

(51) Int. Cl.
*C23C 16/04*    (2006.01)
*C07F 15/06*    (2006.01)
(Continued)

(52) U.S. Cl.
CPC ........ *C07F 15/065* (2013.01); *C23C 16/0209* (2013.01); *C23C 16/0227* (2013.01);
(Continued)

(58) Field of Classification Search
None
See application file for complete search history.

(56) References Cited

U.S. PATENT DOCUMENTS

| 7,172,967 B2 | 2/2007 | Kim et al. |
| 8,372,473 B2 | 2/2013 | Dussarrat |

(Continued)

FOREIGN PATENT DOCUMENTS

| JP | 6146948 B2 | 6/2017 |
| KR | 10-1553357 | 9/2015 |

(Continued)

OTHER PUBLICATIONS

Pasko et al. Synthesis and molecular structures of cobalt(II) b-diketonate complexes as new MOCVD precursors for cobalt oxide films. Polyhedron 23 (2004) 735-741.*

(Continued)

*Primary Examiner* — David P Turocy
(74) *Attorney, Agent, or Firm* — Muir Patent Law, PLLC

(57) ABSTRACT

A method of selectively forming a cobalt metal layer includes supplying a cobalt compound represented by Chemical Formula (1) onto a substrate that includes a wiring line of a late transition metal and an isolation film adjacent thereto, and supplying a reducing gas to selectively form a cobalt metal layer on the wiring line, (Continued)

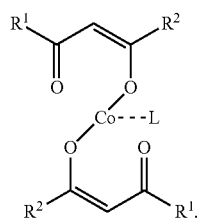

(I)

14 Claims, 5 Drawing Sheets

(51) Int. Cl.
    *C23C 16/02* (2006.01)
    *C23C 16/18* (2006.01)
    *C23C 16/44* (2006.01)
    *H01L 21/285* (2006.01)
    *H01L 21/768* (2006.01)

(52) U.S. Cl.
    CPC .............. *C23C 16/04* (2013.01); *C23C 16/18* (2013.01); *C23C 16/4408* (2013.01); *H01L 21/28562* (2013.01); *H01L 21/28568* (2013.01); *H01L 21/76849* (2013.01)

(56) References Cited

U.S. PATENT DOCUMENTS

| | | | |
|---|---|---|---|
| 9,540,408 | B2 | 1/2017 | Peters |
| 9,583,389 | B2 | 2/2017 | Romero et al. |
| 9,816,180 | B2 | 11/2017 | Haukka et al. |
| 10,242,879 | B2 | 3/2019 | Na et al. |
| 11,390,946 | B2 * | 7/2022 | Hatanpää ................ C23C 16/14 |
| 2009/0269507 | A1 | 10/2009 | Yu et al. |
| 2010/0081275 | A1 | 4/2010 | Ishizaka et al. |
| 2010/0248473 | A1 * | 9/2010 | Ishizaka ............ H01L 21/76883 257/E21.582 |
| 2016/0133563 | A1 | 5/2016 | Ai et al. |
| 2018/0130706 | A1 | 5/2018 | Chen et al. |
| 2019/0100837 | A1 | 4/2019 | Haukka et al. |
| 2019/0368039 | A1 | 12/2019 | Arteaga et al. |

FOREIGN PATENT DOCUMENTS

| | | |
|---|---|---|
| KR | 10-2017-0081248 | 7/2017 |
| KR | 10-1764163 | 7/2017 |
| WO | WO 2009/134840 A2 | 11/2009 |
| WO | WO 2016/073707 A1 | 5/2016 |

OTHER PUBLICATIONS

Bandoli et al. A Cobalt(II) Hexafluoroacetylacetonate Ethylenediamine Complex As a CVD Molecular Source of Cobalt Oxide Nanostructures. Inorganic Chemistry, vol. 48, No. 1, 2009.*
Bandoli et al. A Cobalt (II) Hexafluoroacetylacetonate Ethylenediamine, etc.. Inorg. Chem. 2009, 48, 82-89.
Pasko et al., Cobalt (II), B-Diketonate Adducts as New Precursors, etc.., J. of Crystal Growth, 262 (2004) 653-657.
Maruyama, Cobalt Thin Films Prepared By Chemica Vapor, etc . . . , Jpn. J. Appl. Phys. vol. 36 (1997) 705-707.
Gulino et al. Deposition of Thin Films of Cobalt Oxides By MOCVD, J. Materials Chemistry, Feb. 26, 2003, 861-865.
Burriel et al., Growth Kinetics, Composition, and Morphology, etc.. Chemical Vapor Deposition, 2005, 11, No. 2, 106-111.
Rhee et al. Cobalt Metallorganic Chemical Vapor Deposition, etc.. J. of The Elecrochemical Society, 146(7), 2720-2724 (1999).
Dorovskikh et al., N, N-and O,N-Coodinated CO(II) B-Diketonate, etc . . . Physics Procedia 46 (2013, 193-199.
Pasko et al. Sytheses and Molecular Structures of Colbal (II) B-Diketonate, etc . . . Polyhedron 23 (2004) 735-741.
Guilino et al. Viable Route for the Synthesis of Anhydrous, etc . . . , J. Materials Chemistry, Jun. 14, 2004.
Gulino et al. Cobalt hexafluoroacetylacetonate polyether adducts for thin films of cobalt oxides. Inorganica Chi mica Acta 358, 2005, p. 4466-4472 (Year: 2005).
Gulino et al. "A novel self-generating liquid MOCVD precursor for Co3O4 thin films," Chemistry of materials 15.20 (2003): 3748-3752.

* cited by examiner

METHOD OF SELECTIVELY FORMING COBALT METAL LAYER BY USING COBALT COMPOUND, AND METHOD OF FABRICATING SEMICONDUCTOR DEVICE BY USING COBALT COMPOUND

CROSS-REFERENCE TO RELATED APPLICATION

This application is a continuation of U.S. patent application Ser. No. 16/872,504 filed May 12, 2020, which is incorporated by reference herein in its entirety.

Korean Patent Application No. 10-2019-0093360, filed on Jul. 31, 2019, in the Korean Intellectual Property Office, and entitled: "Cobalt Compound, Method of Selectively Forming Cobalt Metal Layer by Using Cobalt Compound, and Method of Fabricating Semiconductor Device by Using Cobalt Compound," is incorporated by reference herein in its entirety.

BACKGROUND

1. Field

Embodiments relate to a method of selectively forming a cobalt metal layer by using the cobalt compound, and a method of fabricating a semiconductor device by using the cobalt compound.

2. Description of the Related Art

In semiconductor devices, wiring lines may be provided for electricity to flow. When electricity flows in a wiring line, electromigration of material of the wiring lines may occur.

SUMMARY

Embodiments are directed to a method of selectively forming a cobalt metal layer, the method including supplying a cobalt compound represented by Chemical Formula (1) onto a substrate that includes a wiring line of a late transition metal and an isolation film adjacent thereto, and supplying a reducing gas to selectively form a cobalt metal layer on the wiring line,

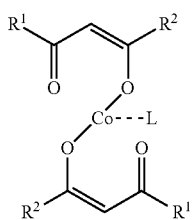

wherein, in the above Chemical Formula (1), L may be a group represented by one of Chemical Formulae (2) to (4), and $R^1$ and $R^2$ may each independently be a C1 to C8 linear or branched alkyl group, in which there may be no substitution or a hydrogen atom may be substituted with a halogen atom,

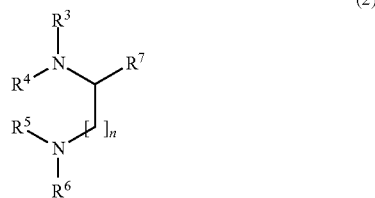

wherein, in the above Chemical Formula (2), $R^3$, $R^4$, $R^5$, $R^6$, and $R^7$ may each be independently hydrogen or a C1 to C8 linear or branched alkyl group, and n may be an integer of 1 to 3,

wherein, in the above Chemical Formula (3), $R^8$ and $R^9$ may each independently be a C1 to C8 linear or branched alkyl group,

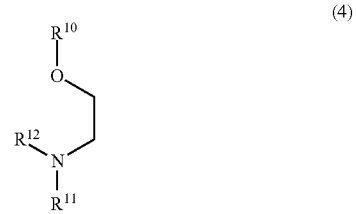

wherein, in the above Chemical Formula (4), $R^{10}$ and $R^{11}$ may each independently be a C1 to C8 linear or branched alkyl group and $R^{12}$ may be hydrogen or a C1 to C8 linear or branched alkyl group.

Embodiments are also directed to a method of selectively forming a cobalt metal layer, the method including: supplying a cobalt compound represented by Chemical Formula (1) onto a substrate that includes a copper wiring line and an isolation film adjacent thereto; and supplying a reducing gas to selectively form a cobalt metal layer on the copper wiring line.

Embodiments are also directed to a method of fabricating a semiconductor device, the method including: providing a substrate that includes a wiring line of a late transition metal and an isolation film adjacent thereto, supplying the cobalt compound represented by Chemical Formula (1) onto the substrate, supplying a reducing gas to selectively form a cobalt metal layer on the wiring line, and forming an insulating layer on the cobalt metal layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
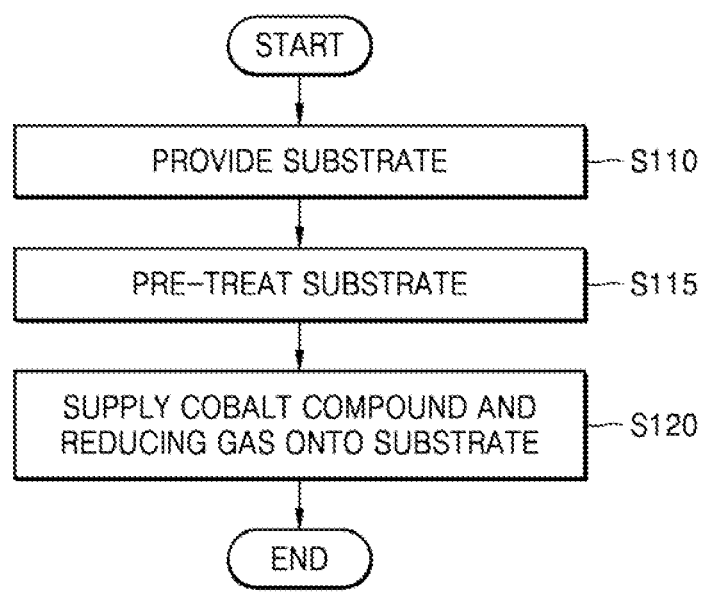
FIG. 1 illustrates a flowchart of a method of selectively forming a cobalt metal layer according to an example embodiment.

A cobalt compound according to an example embodiment is represented by Chemical Formula (1):

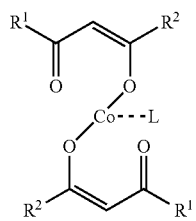

(I)

wherein, in the above Chemical Formula (1), L may be a group represented by one of Chemical Formulae (2) to (4), and $R^1$ and $R^2$ may each independently be a C1 to C8 linear or branched alkyl group. In an example embodiment, in $R^1$ and $R^2$ there is no substitution or one or more hydrogen atoms is substituted with a halogen atom.

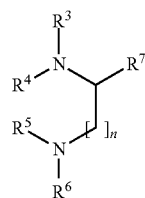

(2)

In the above Chemical Formula (2), $R^3$, $R^4$, $R^5$, $R^6$, and $R^7$ may each independently be hydrogen or a C1 to C8 linear or branched alkyl group, and n may be an integer of 1 to 3. In an example embodiment, not all $R^3$, $R^4$, $R^5$, and $R^6$ are methyl groups when n is 1 and $R^7$ is hydrogen.

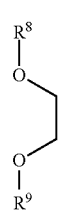

(3)

In the above Chemical Formula (3), $R^8$ and $R^9$ may each independently be a C1 to C8 linear or branched alkyl group. In an example embodiment, $R^8$ and $R^9$ are not simultaneously methyl groups.

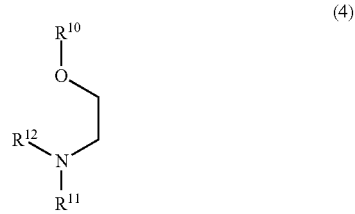

(4)

In the above Chemical Formula (4), $R^{10}$ and $R^{11}$ may each independently be a C1 to C8 linear or branched alkyl group, and $R^{12}$ may be hydrogen or a C1 to C8 linear or branched alkyl group.

In an example embodiment, $R^1$ and $R^2$ may be each independently be a methyl group, a monofluoromethyl group, a difluoromethyl group, a trifluoromethyl group, an ethyl group, a monofluoroethyl group, a difluoroethyl group, a trifluoroethyl group, or a tetrafluoroethyl group.

In an example embodiment, L may have a structure represented by Chemical Formula (2), wherein n may be 1, each of $R^3$, $R^4$, $R^5$, and $R^6$ may be a methyl group, and $R^7$ may be a C2 to C8 linear or branched alkyl group. Thus, L may have a structure represented by Chemical Formula (5):

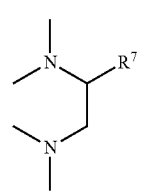

(5)

In an example embodiment, L may have a structure represented by Chemical Formula (2), wherein n may be 2 and $R^7$ may be hydrogen. Thus, L may have a structure represented by Chemical Formula (6):

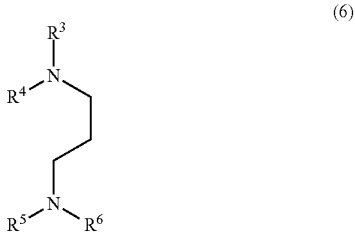

(6)

When L is a group represented by Chemical Formula (2), an unshared electron pair of each of the two nitrogen atoms (N) may be coordinated to the cobalt atom.

In an example embodiment, L may have a structure represented by Chemical Formula (3), wherein each of $R^8$ and $R^9$ may be an n-butyl group. Thus, L may have a structure represented by Chemical Formula (7):

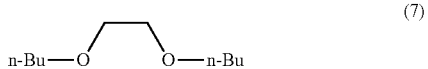
(7)

When L is a group represented by Chemical Formula (3), an unshared electron pair of each of the two oxygen atoms (O) may be coordinated to the cobalt atom.

In an example embodiment, L may have a structure represented by Chemical Formula (4), wherein $R^{10}$ and $R^{11}$ may be each independently a methyl group or an ethyl group, and $R^{12}$ may be hydrogen or a methyl group. Thus, L may have one of structures represented by Chemical Formulae (8):

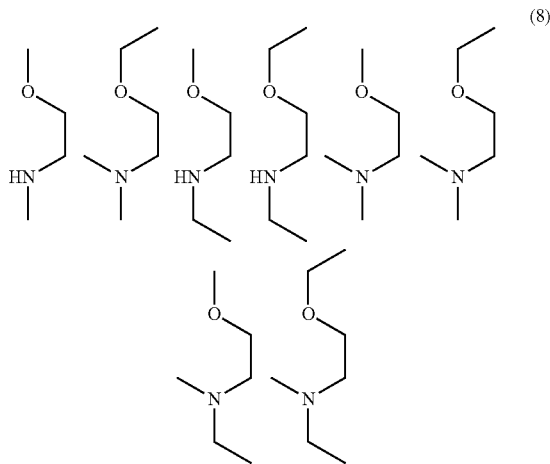
(8)

When L is a group represented by Chemical Formula (4), an unshared electron pair of each of the nitrogen atom (N) and the oxygen atom (O) may be coordinated to the cobalt atom.

Synthesis Method of the Compound Represented by Chemical Formula (1)

Synthesis of the compound represented by Chemical Formula (1) when L is a group represented by Chemical Formula (2)

When L is a group represented by Chemical Formula (2), the compound represented by Chemical Formula (1) may be synthesized, for example, as follows.

In an example embodiment, $Co(R^1$—CO—$CH_2$—CO—$R^2)_2$ (where $R^1$ and $R^2$ are each independently a C1 to C8 linear or branched alkyl group, in which there is no substitution or a hydrogen atom is substituted with a halogen atom) and an alkyl ethylenediamine may be mixed in an organic solvent to perform a reaction at a temperature of about –100° C. to about 100° C., followed by performing separation and purification on the resulting product, thereby obtaining the compound represented by Chemical Formula (1), wherein L is a group represented by Chemical Formula (2).

$R^1$—CO—$CH_2$—CO—$R^2$ may be, for example, acetylacetone, 2,2,6,6-tetramethyl-3,5-heptanedione, 1,1,1,5,5,5-hexafluoro-2,4-pentanedione, or the like according to the selection of $R^1$ and $R^2$.

In addition, some hydrogen atoms in the alkyl ethylenediamine may be substituted with alkyl groups or halogen atoms, and $R^3$, $R^4$, $R^5$, $R^6$, and $R^7$ may be determined according to the alkyl groups or the halogen atoms, which are substituted. The alkyl ethylenediamine may include, for example, n-butyl(dimethyl)ethylenediamine, dimethyl(hexyl)ethylenediamine, diisopropyl(dimethyl)ethylenediamine, tetramethylethylenediamine, tetramethylpropylenediamine, tetramethylbutylenediamine, 1,3-bis(dimethylamino)propane, 1,4-bis(dimethylamino)butane, or the like.

The alkyl ethylenediamine may be present in an amount of, for example, about 0.4 mol to about 1.4 mol, about 0.6 mol to about 1.2 mol, or about 0.8 mol to about 1.1 mol, based on 1 mol of $Co(R^1$—CO—$CH_2$—CO—$R^2)_2$.

The reaction set forth above may be performed at a temperature of about –100° C. to about 100° C., about –80° C. to about 40° C., or about –40° C. to about 40° C. for about 30 minutes to about 24 hours.

Examples of the organic solvent may include halogenated hydrocarbons such as chloroform, dichloromethane, and dichloroethane; ethers such as diethyl ether, tetrahydrofuran, dimethoxyethane, and dioxane; aliphatic hydrocarbons such as hexane, heptane, cyclohexane, methylcyclohexane, and ethylcyclohexane; and aromatic hydrocarbons such as toluene and xylene, and these organic solvents may be used alone or in combination. In an example embodiment, the method may not use the organic solvent.

The organic solvent may be present in an amount of about 0 g to about 100 g or about 0 g to about 50 g based on 1 g of $Co(R^1$—CO—$CH_2$—CO—$R^2)_2$. Here, 0 g of the organic solvent refers to a case of omitting the organic solvent.

After the completion of the reaction, the compound represented by Chemical Formula (1) may be separated and purified by a method such as distillation, recrystallization, extraction, filtration, concentration, sublimation, column chromatography, or the like.

In an example embodiment, cobalt hydroxide ($Co(OH)_2$), $R^1$—CO—$CH_2$—CO—$R^2$ (where $R^1$ and $R^2$ are each independently a C1 to C8 linear or branched alkyl group, in which there is no substitution or a hydrogen atom is substituted with a halogen atom), and an alkyl ethylenediamine may be mixed in an organic solvent to perform a reaction at a temperature of about –100° C. to about 100° C., followed by performing separation and purification on the resulting product, thereby obtaining the compound represented by Chemical Formula (1), wherein L is a group represented by Chemical Formula (2).

In addition, some hydrogen atoms in the alkyl ethylenediamine may be substituted with alkyl groups or halogen atoms, and descriptions of this have been made above and thus will be omitted.

The alkyl ethylenediamine may be present in an amount of, for example, about 0.4 mol to about 1.4 mol, about 0.6 mol to about 1.2 mol, or about 0.8 mol to about 1.1 mol, based on 1 mol of cobalt hydroxide. In addition, $R^1$—CO—$CH_2$—CO—$R^2$ may be present in an amount of, for example, about 1.6 mol to about 3 mol, about 1.8 mol to about 2.5 mol, or about 2 mol to about 2.3 mol, based on 1 mol of cobalt hydroxide.

The reaction set forth above may be performed at a temperature of about –100° C. to about 100° C., about –80° C. to about 40° C., or about –40° C. to about 40° C. for about 30 minutes to about 24 hours.

The kinds and amounts of the organic solvent are substantially the same as those described in the aforementioned method, and thus, descriptions thereof will be omitted.

After the completion of the reaction, the compound represented by Chemical Formula (1) may be separated and purified by a method such as distillation, recrystallization, extraction, filtration, concentration, sublimation, column chromatography, or the like.

Synthesis of the compound represented by Chemical Formula (1) when L is a group represented by Chemical Formula (3)

When L is a group represented by Chemical Formula (3), the compound represented by Chemical Formula (1) may be synthesized, for example, as follows.

In an example embodiment, $Co(R^1—CO—CH_2—CO—R^2)_2$ (where $R^1$ and $R^2$ are each independently a C1 to C8 linear or branched alkyl group, in which there is no substitution or a hydrogen atom is substituted with a halogen atom) and a dialkoxy ethane may be mixed in an organic solvent to perform a reaction at a temperature of about −100° C. to about 100° C., followed by performing separation and purification on the resulting product, thereby obtaining the compound represented by Chemical Formula (1), wherein L is a group represented by Chemical Formula (3).

$R^1$—CO—$CH_2$—CO—$R^2$ may be, for example, acetylacetone, 2,2,6,6-tetramethyl-3,5-heptanedione, 1,1,1,5,5,5-hexafluoro-2,4-pentanedione, or the like according to the selection of $R^1$ and $R^2$.

An alkyl group included in an alkoxy group (that is, an alkyl group bonded to an oxygen atom) of the dialkoxy ethane may be a C1 to C8 linear or branched alkyl group, for example, an n-butyl group.

The dialkoxy ethane may be present in an amount of, for example, about 0.4 mol to about 1.4 mol, about 0.6 mol to about 1.2 mol, or about 0.8 mol to about 1.1 mol, based on 1 mol of $Co(R^1—CO—CH_2—CO—R^2)_2$.

The reaction set forth above may be performed at a temperature of about −100° C. to about 100° C., about −80° C. to about 40° C., or about −40° C. to about 40° C. for about 30 minutes to about 24 hours.

The kinds and amounts of the organic solvent are substantially the same as those described when L is a group represented by Chemical Formula (2), and thus, descriptions thereof will be omitted.

After the completion of the reaction, the compound represented by Chemical Formula (1) may be separated and purified by a method such as distillation, recrystallization, extraction, filtration, concentration, sublimation, column chromatography, or the like.

In an example embodiment, cobalt hydroxide $(Co(OH)_2)$, $R^1$—CO—$CH_2$—CO—$R^2$ (where $R^1$ and $R^2$ are each independently a C1 to C8 linear or branched alkyl group, in which there is no substitution or a hydrogen atom is substituted with a halogen atom), and a dialkoxy ethane may be mixed in an organic solvent to perform a reaction at a temperature of about −100° C. to about 100° C., followed by performing separation and purification on the resulting product, thereby obtaining the compound represented by Chemical Formula (1), wherein L is a group represented by Chemical Formula (3).

In addition, a substituent of the dialkoxy ethane is the same as that described above, and thus, descriptions thereof will be omitted.

The dialkoxy ethane may be present in an amount of, for example, about 0.4 mol to about 1.4 mol, about 0.6 mol to about 1.2 mol, or about 0.8 mol to about 1.1 mol, based on 1 mol of cobalt hydroxide. In addition, $R^1$—CO—$CH_2$—CO—$R^2$ may be present in an amount of, for example, about 1.6 mol to about 3 mol, about 1.8 mol to about 2.5 mol, or about 2 mol to about 2.3 mol, based on 1 mol of cobalt hydroxide.

The reaction set forth above may be performed at a temperature of about −100° C. to about 100° C., about −80° C. to about 40° C., or about −40° C. to about 40° C. for about 30 minutes to about 24 hours.

The kinds and amounts of the organic solvent are substantially the same as those described in the aforementioned method, and thus, descriptions thereof will be omitted.

After the completion of the reaction, the compound represented by Chemical Formula (1) may be separated and purified by a method such as distillation, recrystallization, extraction, filtration, concentration, sublimation, column chromatography, or the like.

Synthesis of the compound represented by Chemical Formula (1) when L is a group represented by Chemical Formula (4)

When L is a group represented by Chemical Formula (4), the compound represented by Chemical Formula (1) may be synthesized, for example, as follows.

In an example embodiment, $Co(R^1—CO—CH_2—CO—R^2)_2$ (where $R^1$ and $R^2$ are each independently a C1 to C8 linear or branched alkyl group, in which there is no substitution or a hydrogen atom is substituted with a halogen atom) and an alkoxyalkyl ethanamine may be mixed in an organic solvent to perform a reaction at a temperature of about −100° C. to about 100° C., followed by performing separation and purification on the resulting product, thereby obtaining the compound represented by Chemical Formula (1), wherein L is a group represented by Chemical Formula (4).

$R^1$—CO—$CH_2$—CO—$R^2$ may be, for example acetylacetone, 2,2,6,6-tetramethyl-3,5-heptanedione, 1,1,1,5,5,5-hexafluoro-2,4-pentanedione, or the like according to the selection of $R^1$ and $R^2$.

In addition, in the alkoxyalkyl ethanamine, each of an alkyl group included in an alkoxy group (that is, an alkyl group bonded to an oxygen atom) and an alkyl group bonded to a nitrogen atom may be a C1 to C8 linear or branched alkyl group.

The alkoxyalkyl ethanamine may be present in an amount of, for example, about 0.4 mol to about 1.4 mol, about 0.6 mol to about 1.2 mol, or about 0.8 mol to about 1.1 mol, based on 1 mol of $Co(R^1—CO—CH_2—CO—R^2)_2$.

The reaction set forth above may be performed at a temperature of about −100° C. to about 100° C., about −80° C. to about 40° C., or about −40° C. to about 40° C. for about 30 minutes to about 24 hours.

The kinds and amounts of the organic solvent are substantially the same as those described when L is a group represented by Chemical Formula (2), and thus, descriptions thereof will be omitted.

After the completion of the reaction, the compound represented by Chemical Formula (1) may be separated and purified by a method such as distillation, recrystallization, extraction, filtration, concentration, sublimation, column chromatography, or the like.

In an example embodiment, cobalt hydroxide $(Co(OH)_2)$, $R^1$—CO—$CH_2$—CO—$R^2$ (where $R^1$ and $R^2$ are each independently a C1 to C8 linear or branched alkyl group, in which there is no substitution or a hydrogen atom is substituted with a halogen atom), and an alkoxyalkyl ethanamine may be mixed in an organic solvent to perform a reaction at a temperature of about −100° C. to about 100° C., followed by performing separation and purification on the resulting product, thereby obtaining the compound represented by Chemical Formula (1), wherein L is a group represented by Chemical Formula (4).

A substituent of the alkoxyalkyl ethanamine is the same as that described above, and thus, descriptions thereof will be omitted.

The alkoxyalkyl ethanamine may be present in an amount of, for example, about 0.4 mol to about 1.4 mol, about 0.6 mol to about 1.2 mol, or about 0.8 mol to about 1.1 mol, based on 1 mol of cobalt hydroxide. In addition, $R^1$—CO—$CH_2$—CO—$R^2$ may be present in an amount of, for example, about 1.6 mol to about 3 mol, about 1.8 mol to about 2.5 mol, or about 2 mol to about 2.3 mol, based on 1 mol of cobalt hydroxide.

The reaction set forth above may be performed at a temperature of about −100° C. to about 100° C., about −80° C. to about 40° C., or about −40° C. to about 40° C. for about 30 minutes to about 24 hours.

The kinds and amounts of the organic solvent are substantially the same as those described in the aforementioned method, and thus, descriptions thereof will be omitted.

After the completion of the reaction, the compound represented by Chemical Formula (1) may be separated and purified by a method such as distillation, recrystallization, extraction, filtration, concentration, sublimation, column chromatography, or the like.

[Selective Formation of Co Metal Layer by Using Compound Represented by Chemical Formula (1)]

Hereinafter, a method according to an example embodiment for selectively forming a cobalt (Co) metal layer on a late transition metal by using the compound represented by Chemical Formula (1) will be described.

Figure 2:
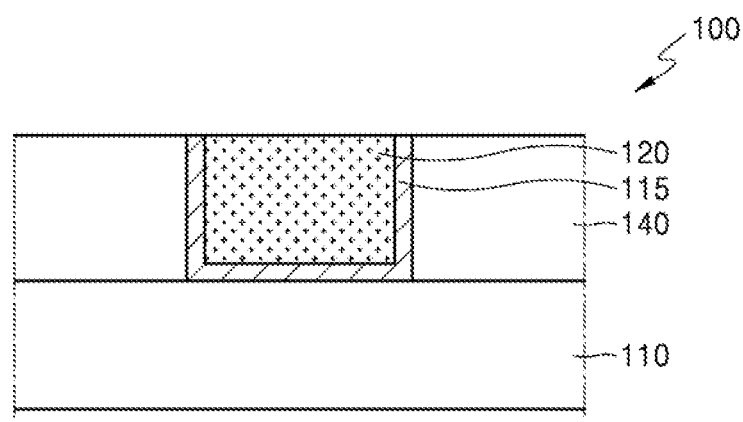
FIGS. 2 to 3C illustrate side views of stages in a method of selectively forming a cobalt metal layer according to an example embodiment.

FIG. 1 is a flowchart schematically illustrating a method of selectively forming a cobalt metal layer 130 according to an example embodiment. FIGS. 2 to 3C are side views each illustrating the method of selectively forming the cobalt metal layer 130 according to example embodiments.

Referring to FIGS. 1 and 2, a substrate 100 may be provided into a reaction space (S110).

The substrate 100 may have an underlying barrier layer 115 on a base substrate 110, and may include a metal wiring line 120 on the underlying barrier layer 115. The dimension of the metal wiring line 120 may be varied, and the metal wiring line 120 may include a late transition metal. In an example embodiment, the metal wiring line 120 may be an alloy containing a late transition metal. In an example embodiment, the metal wiring line 120 may include a late transition metal.

The late transition metal may be one or more selected from the group of copper (Cu), iron (Fe), cobalt (Co), nickel (Ni), zinc (Zn), cadmium (Cd), osmium (Os), mercury (Hg), platinum (Pt), palladium (Pd), rhodium (Rh), iridium (Ir), silver (Ag), gold (Au), ruthenium (Ru), and alloys thereof.

In an example embodiment, a side surface and a bottom surface of the metal wiring line 120 may be covered with the underlying barrier layer 115 for preventing diffusion or electromigration (EM) of a material constituting the metal wiring line 120. The dimension of the underlying barrier layer 115 may be varied.

In an example embodiment, the underlying barrier layer 115 may include, for example, a single layer or multilayer including Ti, TiN, Ta, TaN, MnOx, or the like.

In another example embodiment, the underlying barrier layer 115 may include, for example, a silicon oxide film, a silicon nitride film, a copper oxide film, a titanium nitride film, a titanium oxide film, a tantalum nitride film, a tantalum oxide film, a ruthenium oxide film, a zirconium oxide film, a hafnium oxide film, a lanthanum oxide film, or the like.

The base substrate 110 may include, for example, a semiconductor substrate such as Si or Ge; or at least one compound semiconductor selected from the group of SiGe, SiC, GaAs, InAs, and InP. The base substrate 110 may include a conductive region, for example, an impurity-doped well or an impurity-doped structure.

An isolation film 140 including an electrical insulator may be arranged on a lateral side of the metal wiring line 120. The isolation film 140 may include, for example, a high-density plasma (HDP) oxide film, tetraethyl orthosilicate (TEOS), plasma enhanced TEOS (PE-TEOS), O3-TEOS, undoped silicate glass (USG), phosphosilicate glass (PSG), borosilicate glass (BSG), borophosphosilicate glass (BPSG), fluorosilicate glass (FSG), spin-on glass (SOG), tonen silazane (TOSZ), or a combination thereof. In another example embodiment, the isolation film 140 may include silicon nitride, silicon oxynitride, or a low-k material having a low dielectric constant.

In an example embodiment, a top surface of the metal wiring line 120 may be exposed, i.e., may not be covered with the isolation film 140. In an example embodiment, a top surface of the isolation film 140 may be substantially coplanar with the top surface of the metal wiring line 120. In an example embodiment, a level of the exposed top surface of the metal wiring line 120 may be lower than a level of the top surface of the isolation film 140.

In an example embodiment, before operation S120 of supplying a cobalt compound and a reducing gas onto the substrate 100, the substrate 100 may undergo a pre-treatment (S115). The pre-treatment may be performed by a method such as a plasma treatment, a heat treatment, a chemical treatment, or the like. For example, the plasma treatment may be performed by generating plasma at a power of about 10 W to about 800 W, about 20 W to about 500 W, or about 40 W to about 200 W and plasma-treating the substrate 100 at a temperature of about 100° C. to about 400° C. for about 1 second to about 10 minutes or about 10 seconds to about 5 minutes. The heat treatment may be performed, for example, at a temperature of about 300° C. to about 600° C. or about 350° C. to about 500° C. in an atmosphere of hydrogen, nitrogen, or ammonia. The chemical treatment may be performed, for example, by treating the substrate 100 with hydrofluoric acid diluted to about 1% (i.e., diluted HF, or dHF) for about 1 minute.

Figure 3A:
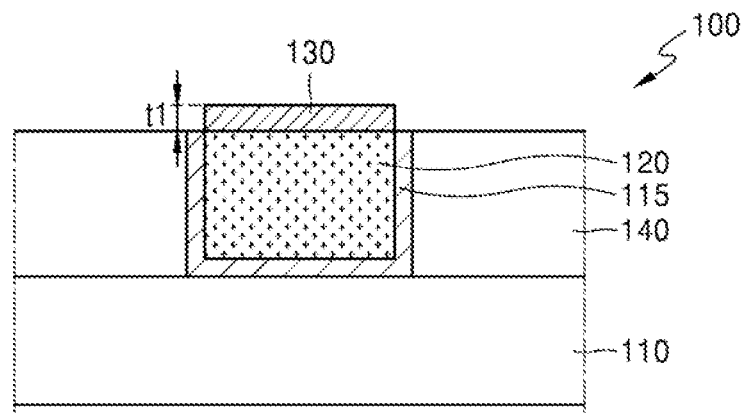

Referring to FIGS. 1 and 3A, a cobalt compound and a reducing gas may be supplied onto the substrate 100 (S120).

The cobalt compound may be a compound represented by Chemical Formula (1). The reducing gas may include, for example, at least one selected from the group consisting of $H_2$, $N_2$, $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HN$—$NH_2$, $(CH_3)_2N$—$NH_2$, phenylhydrazine, pyrazoline, and radicals thereof.

By supplying the cobalt compound and the reducing gas, the cobalt metal layer 130 may be selectively formed on the metal wiring line 120. Here, the statement that the cobalt metal layer 130 is "selectively" formed means that the cobalt metal layer 130 is more preferentially deposited on the metal wiring line 120 than on a surface of the isolation film 140. Thus, the cobalt metal layer 130 is formed on the metal wiring line 120 at certain selectivity as compared with that on the surface of the isolation film 140. The selectivity may be, for example, 30:1 or more, 60:1 or more, 100:1 or more, 200:1 or more, 350:1 or more, 500:1 or more, or 1000:1 or more.

It may be seen that, when formed by using the cobalt compound represented by Chemical Formula (1), a cobalt metal layer is formed on the metal wiring line 120 at extremely high selectivity. In particular, a large number of examples, in which the cobalt metal layer was not formed on the isolation film 140 while formed on the metal wiring line 120, were observed, whereby it was shown that the cobalt metal layer was formed at extremely high selectivity such as 1000:1.

The cobalt metal layer 130 may be selectively formed to a constant thickness t1 on the metal wiring line 120. In an example embodiment, the cobalt metal layer 130 may be formed to a constant thickness t1 only on the metal wiring line 120.

Figure 3B:
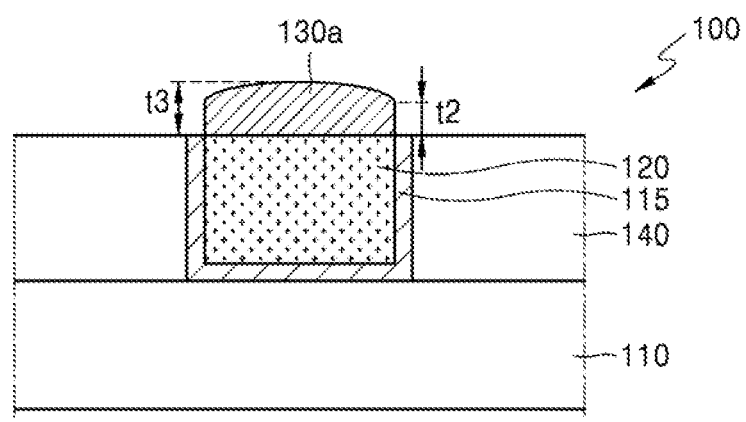
Figure 3C:
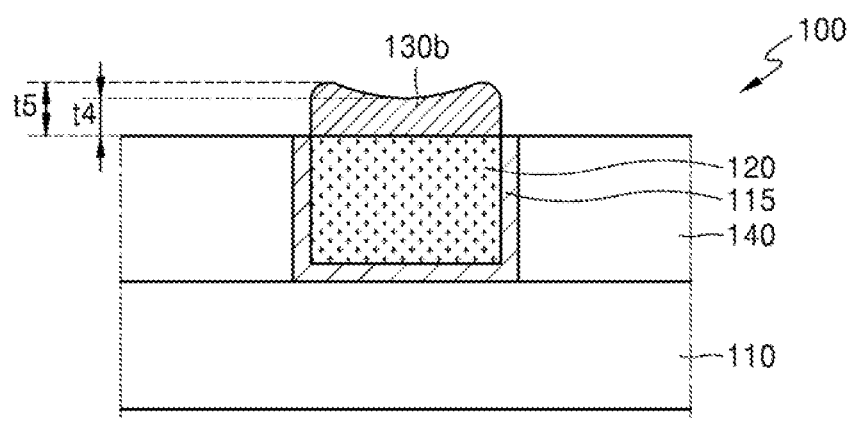

The embodiment of FIG. 3B is substantially identical to the embodiment of FIG. 3A except that the thickness of a cobalt metal layer 130a varies depending upon positions. Referring to FIG. 3B, the cobalt metal layer 130a may have a thickness t2 at an edge thereof and have a thickness t3 that is greater than the thickness t2 in a central portion thereof.

The embodiment of FIG. 3C is substantially identical to the embodiment of FIG. 3A except that the thickness of a cobalt metal layer 130b varies depending upon positions. Referring to FIG. 3C, the cobalt metal layer 130b may have a maximum thickness t5 at a portion close to an edge thereof and have a thickness t4 that is less than the thickness t5 in a central portion thereof.

In an example embodiment, each of the cobalt metal layers 130, 130a, and 130b of FIGS. 3A to 3C may include carbon in an extremely low amount such as about 0 wt % to about 3 wt %. Here, the statement that the amount of carbon in each of the cobalt metal layers 130, 130a, and 130b is 0 wt % means that each of the cobalt metal layers 130, 130a, and 130b does not include carbon.

The metal wiring line 120 may be a portion of a semiconductor device, for example, a bit line or a word line of a memory device such as dynamic random access memory (DRAM) or vertical NAND (VNAND), a contact plug of a logic device, or a redistribution line on a semiconductor package, an interposer, or a semiconductor chip.

The cobalt compound represented by Chemical Formula (1) may be used in, for example, a chemical vapor deposition (CVD) process or an atomic layer deposition (ALD).

Figure 4:
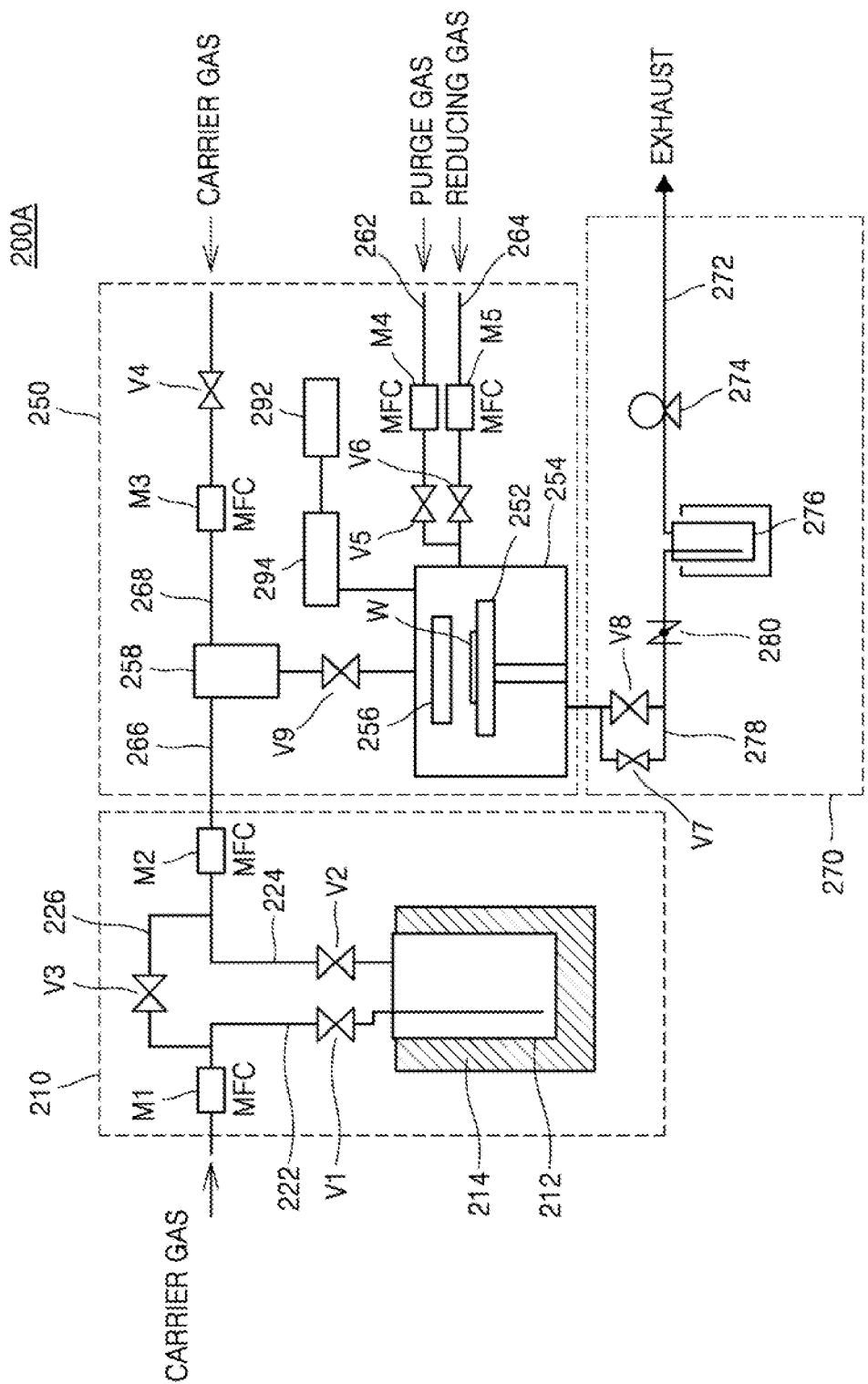
FIG. 4 illustrates a schematic diagram of a configuration of an example deposition apparatus for a process of selectively forming a cobalt metal layer according to an example embodiment.

FIG. 4 is a diagram schematically illustrating a configuration of a deposition apparatus 200A, as an example, which may be used for a process of selectively forming a cobalt metal layer, according to an example embodiment.

The deposition apparatus 200A illustrated in FIG. 4 includes a fluid transfer unit 210, a thin film forming unit 250 in which a deposition process for forming a thin film on a substrate W is performed by using a process gas supplied from a raw material container 212 in the fluid transfer unit 210, and an exhaust system 270 for discharging gases remaining after use for reaction in the thin film forming unit 250 or discharging reaction by-products.

The thin film forming unit 250 includes a reaction chamber 254 including a susceptor 252 which supports the substrate W. A shower head 256 for supplying a gas supplied by the fluid transfer unit 210 onto the substrate W is mounted in an upper end portion inside the reaction chamber 254.

The fluid transfer unit 210 includes an inflow line 222 for supplying a carrier gas to the raw material container 212 from outside the deposition apparatus 200A, and an outflow line 224 for supplying a raw material compound contained in the raw material container 212 to the thin film forming unit 250. Valves V1 and V2 and mass flow controllers (MFCs) M1 and M2 may be respectively mounted on the inflow line 222 and the outflow line 224. The inflow line 222 and the outflow line 224 may be connected to each other through a bypass line 226. A valve V3 is mounted on the bypass line 226. The valve V3 may be pneumatically operated by an electric motor or another remote-controllable means.

The raw material compound supplied from the raw material container 212 may be supplied into the reaction chamber 254 through an inflow line 266 of the thin film forming unit 250, the inflow line 266 being connected to the outflow line 224 of the fluid transfer unit 210. The raw material compound supplied from the raw material container 212, together with the carrier gas supplied through an inflow line 268, may be supplied into the reaction chamber 254, as needed. A valve V4 and an MFC M3 may be mounted on the inflow line 268 through which the carrier gas flows.

The thin film forming unit 250 includes an inflow line 262 for supplying a purge gas into the reaction chamber 254, and an inflow line 264 for supplying a reducing gas into the reaction chamber 254. Valves V5 and V6 and MFCs M4 and M5 may be respectively mounted on the inflow lines 262 and 264.

The used process gas and waste reaction by-products in the reaction chamber 254 may be discharged to the outside of the deposition apparatus 200A through the exhaust system 270. The exhaust system 270 may include an exhaust line 272 connected to the reaction chamber 254, and a vacuum pump 274 mounted on the exhaust line 272. The vacuum pump 274 may remove the process gas and the waste reaction by-products, which are discharged from the reaction chamber 254.

A trap 276 may be mounted on the exhaust line 272 at the upstream side of the vacuum pump 274. For example, the trap 276 may capture the reaction by-products generated by the process gas, which has not completely reacted in the reaction chamber 254, and thus cause the reaction by-products not to flow in the vacuum pump 274 at the downstream side of the trap 276.

In a method of forming a thin film, according to an example embodiment, the cobalt compound according to an example embodiment is used as the raw material compound, the cobalt compound having a structure represented by Chemical Formula (1). In particular, the cobalt compound may be present in a liquid state at room temperature and may be selectively deposited on a metal wiring line of the substrate W by reacting with a reducing gas.

In addition, a bypass line 278 and an automatic pressure controller 280 may be mounted on the exhaust line 272 at the upstream side of the trap 276. Valves V7 and V8 may be respectively mounted on the bypass line 278 and a portion of the exhaust line 272 extending parallel to the bypass line 278.

In an example embodiment, a heater 214 may be mounted on the raw material container 212. The raw material compound contained in the raw material container 212 may be maintained at a relatively high temperature by the heater 214.

In an example embodiment, a vaporizer 258 may be mounted on the inflow line 266 or the thin film forming unit 250. The vaporizer 258 may vaporize a fluid, which is supplied in a liquid state by the fluid transfer unit 210, and may supply the vaporized raw material compound into the reaction chamber 254. A temperature for vaporizing the fluid internal to the vaporizer 258 may be about −10° C. to about 200° C., about 20° C. to about 150° C., or about 50° C. to about 120° C. The raw material compound vaporized in the vaporizer 258, together with the carrier gas supplied through the inflow line 268, may be supplied into the reaction chamber 254. Inflow of the raw material compound supplied into the reaction chamber 254 through the vaporizer 258 may be controlled by a valve V9.

In an example embodiment, to generate plasma inside the reaction chamber 254, the thin film forming unit 250 may include a high-frequency power supply 292 and an RF matching system 294, which are connected to the reaction chamber 254.

To form a cobalt metal layer on the substrate W according to operation S120 in FIG. 1, the cobalt compound having a structure represented by Chemical Formula (1) may be transferred by various methods and thus supplied into a reaction chamber of a thin film forming apparatus, for example, the reaction chamber 254 of the deposition apparatus 200A.

In an example embodiment, to form a thin film by a CVD process using the cobalt compound having a structure represented by Chemical Formula (1) according to an example embodiment, a gas transfer method may be used, the gas transfer method including: vaporizing the cobalt compound through heating and/or decompression in the raw material container 212; and supplying the vaporized cobalt compound, if necessary, together with the carrier gas such as Ar, $N_2$, He, or the like, into the reaction chamber 254. When the gas transfer method is used, the cobalt compound itself according to an example embodiment may be used as the raw material compound for forming a thin film in the CVD process.

In an example embodiment, to form a thin film by a CVD process using the cobalt compound according to an example embodiment, a liquid transfer method may be used, the liquid transfer method including: transferring the cobalt compound in a liquid or solution state to the vaporizer 258; vaporizing the cobalt compound through heating and/or decompression in the vaporizer 258; and supplying the vaporized cobalt compound into the reaction chamber 254. When the liquid transfer method is used, the cobalt compound itself according to an example embodiment, or a solution in which the cobalt compound is dissolved in an organic solvent may be used as the raw material compound for forming a thin film in the CVD process.

In an example embodiment, the organic solvent may include: acetate esters such as ethyl acetate and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methylcyclohexanone; aliphatic hydrocarbons such as hexane, cyclohexane, methylcyclohexane, dimethylcyclohexane, ethylcyclohexane, heptane, and octane; aromatic hydrocarbons such as toluene, xylene, and ethylbenzene; cyano group-containing hydrocarbons such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; lutidine; or the like.

In a method of selectively forming a cobalt metal layer, according to an example embodiment, the cobalt metal layer may be selectively formed on a metal wiring line by using the cobalt compound having a structure represented by Chemical Formula (1), in the deposition apparatus 200A illustrated in FIG. 4. For example, to form the cobalt metal layer, the cobalt compound having a structure represented by Chemical Formula (1) may be supplied into the reaction chamber 254 maintained at a temperature of about 80° C. to about 500° C. and a pressure of about 1 Pa to about 200 kPa.

In an example embodiment, the cobalt compound, together with the reducing gas described above, may be supplied onto the substrate W. The reducing gas may be present in an amount of about 3 wt % to about 99 wt %, about 5 wt % to about 98 wt %, about 10 wt % to about 97 wt %, about 20 wt % to about 95 wt %, or about 40 wt % to about 90 wt %, based on a total amount of gases supplied onto the substrate W.

The pressure internal to the reaction chamber 254 during the formation of the cobalt metal layer may be about 1 Pa to about 200 kPa, about 10 Pa to about 180 kPa, about 30 Pa to about 150 kPa, about 70 Pa to about 130 kPa, or about 133 Pa to about 110 kPa.

The temperature of the substrate W during the formation of the cobalt metal layer may be about 80° C. to about 500° C., about 100° C. to about 450° C., about 120° C. to about 400° C., about 150° C. to about 350° C., or about 180° C. to about 300° C.

In an example embodiment, to form the cobalt metal layer, a thermal CVD process, in which the cobalt metal layer is formed by reacting a reducing gas with a raw material gas including the cobalt compound only by using heat, a plasma-enhanced CVD process using heat and plasma, a photo CVD process using heat and light, or a photo plasma CVD process using heat, light, and plasma may be used.

The cobalt metal layer formed by the method according to an example embodiment may be formed without post-treatment such as annealing or plasma treatment. Thus, due to an extremely high amount of cobalt in the formed cobalt metal layer, annealing or plasma treatment for removing impurities such as carbon may be avoided.

Figure 5:
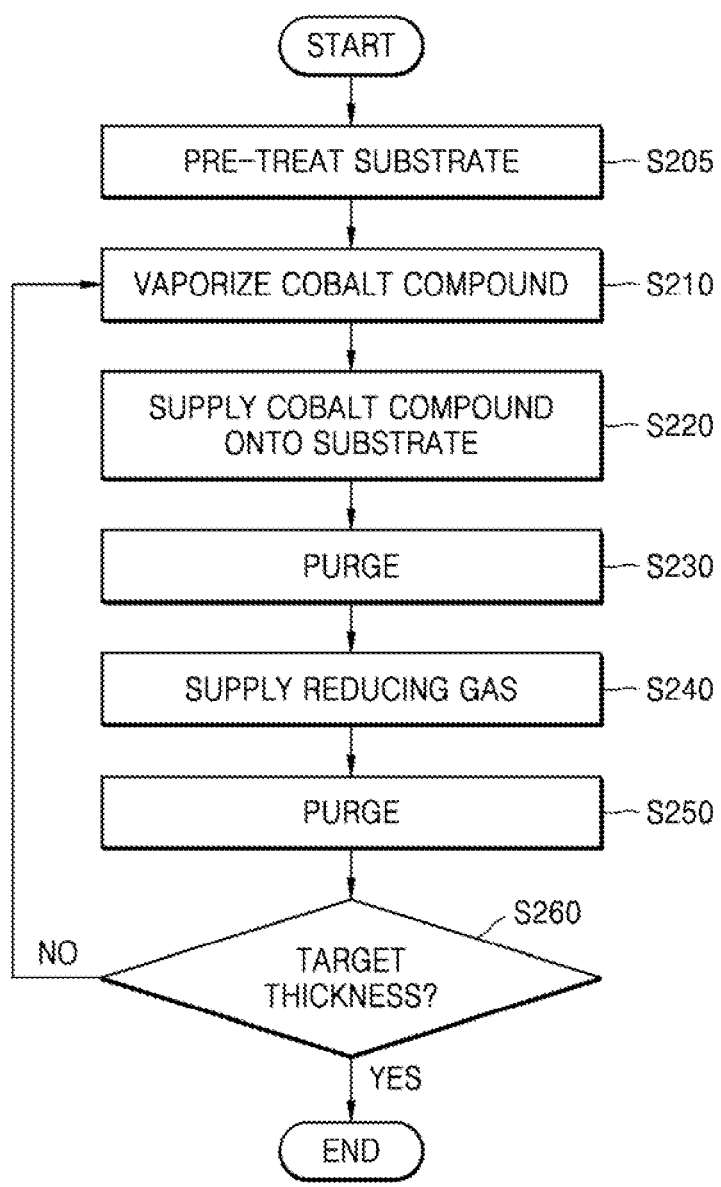
FIG. 5 illustrates a flowchart of a method of forming a cobalt metal layer by an atomic layer deposition process according to an example embodiment.

FIG. 5 is a flowchart specifically illustrating an example method of forming a cobalt metal layer by an ALD process, according to an example embodiment.

Referring to FIG. 5, a source gas may be obtained by vaporizing a solution including the cobalt compound described above (S210).

Next, the source gas including the cobalt compound may be supplied onto the substrate 100 (S220). The cobalt compound may be chemisorbed onto the substrate 100. In addition, an excess of the cobalt compound may be physisorbed onto the substrate 100.

Next, an excess of the source gas and the physisorbed cobalt compound may be removed from a reaction chamber by supplying a purge gas onto the substrate 100 (S230).

Next, a reducing gas is supplied onto the substrate 100. The reducing gas may react with the cobalt compound chemisorbed onto the substrate 100, thereby forming a cobalt metal layer (S240). Because the reducing gas has been described above in detail, repeated descriptions thereof will be omitted.

Next, an excess of the reducing gas and reaction by-products generated by the reaction set forth above may be removed from the reaction chamber by supplying the purge gas onto the substrate 100 (S250).

In an example embodiment, the cobalt compound may be selectively chemisorbed onto a metal wiring line of the substrate 100, and the chemisorbed cobalt compound may react with the reducing gas, whereby the cobalt metal layer may be selectively formed on the metal wiring line. However, the inventive concept is not limited to such a particular mechanism or theory.

In an example embodiment, without being bound by theory it is believed that the cobalt compound may be uniformly chemisorbed onto the substrate 100, and a portion of the cobalt compound, which is chemisorbed onto the metal wiring line, may preferentially react with the reducing gas, whereby the cobalt metal layer may be selectively formed on the metal wiring line.

For the ALD reaction described above, the temperature of the substrate 100 may be maintained at about 80° C. to about 500° C., about 100° C. to about 450° C., about 120° C. to about 400° C., about 150° C. to about 350° C., or about 180° C. to about 300° C.

In addition, for the ALD reaction described above, the pressure internal to the reaction chamber may be maintained at, for example, about 1 Pa to about 200 kPa, about 10 Pa to about 180 kPa, about 30 Pa to about 150 kPa, about 70 Pa to about 130 kPa, or about 133 Pa to about 110 kPa Further, a deposition rate of the cobalt metal layer may be controlled by adjusting supply conditions (for example, a vaporization temperature and a vaporization pressure) of the raw material compound, a reaction temperature, a reaction pressure, or the like. In the method of selectively forming the cobalt metal layer, according to an example embodiment, the deposition rate of the cobalt metal layer may be selected from a range of about 0.01 nm/min to about 100 nm/min, for example, about 1 nm/min to about 50 nm/min, for example.

When the cobalt metal layer is formed by the ALD process, energy such as plasma, light, electricity, or the like may be applied. A time point for applying energy as such may be variously selected. For example, at a time point at which the source gas including the cobalt compound is introduced into the reaction chamber, at a time point at which the source gas is adsorbed onto the substrate, at a time point at which an exhaust process is performed by using the purge gas, at a time point at which a reactive gas is introduced into the reaction chamber, or between these time points, the energy such as plasma, light, voltage, or the like may be applied.

Next, it may be determined whether the cobalt metal layer has a target thickness (S260), and when the thickness of the cobalt metal layer is less than the target thickness, the operations described above, which form a cycle, may be repeated.

In an example embodiment, before repeating the cycles of the operations, the method described above may further include operation S205 of performing a pre-treatment on the substrate 100. Operation S205 of performing the pre-treatment may be substantially the same as operation S115 of performing the pre-treatment, which has been described with reference to FIG. 1, and repeated descriptions thereof will be omitted.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of bis(hexafluoroacetylacetonato)cobaltdibutoxyethane

Bis(hexafluoroacetylacetonato)cobaltdibutoxyethane represented by Chemical Formula (9) was synthesized as follows.

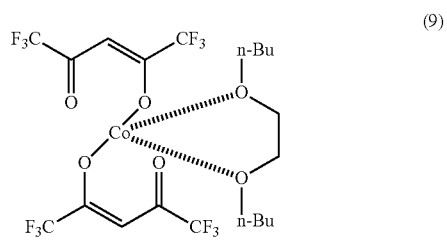

(9)

3.34 g (36.0 mmol) of cobalt hydroxide, 300 mL of methylene chloride, 15.0 g (71.9 mmol) of hexafluoroacetylacetone, and 6.27 g (36.0 mmol) of dibutoxyethane were mixed in a 500 ml-internal-volume flask equipped with a stirrer, a thermometer, and a dropping funnel. Next, the mixture prepared as above was stirred at room temperature for 4 hours. After the completion of the reaction, the reaction solution was filtered, followed by concentrating the filtered solution, and then the concentrate underwent reduced-pressure distillation (oil bath temperature: 110° C., 133.3 Pa), thereby obtaining 12.78 g of bis(hexafluoroacetylacetonato)cobaltdibutoxyethane as a reddish brown liquid. (yield: 55%)

Bis(hexafluoroacetylacetonato)cobaltdibutoxyethane was a novel compound exhibiting the following material properties.

Element analysis: Calcd: H, 3.7; C, 37.1 Found: H, 3.6; C, 37.3.

TG residue: <1 wt %, T1/2: 199

Synthesis Example 2

Synthesis of bis(acetylacetonato)cobaltdimethyl(hexyl)ethylenediamine

Bis(acetylacetonato)cobaltdimethyl(hexyl)ethylenediamine represented by Chemical Formula (10) was synthesized as follows.

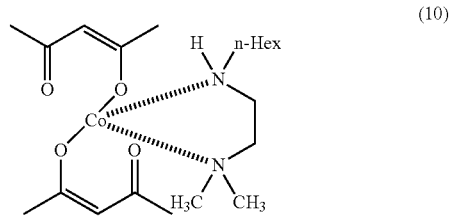

(10)

Synthesis of N,N-dimethylamino-N'-hexylethylenediamine: 6.00 g (42 mmol) of 2-(dimethylamino)ethylchloride hydrochloride, 25.00 g (250 mmol) of n-hexylamine, and 20 mL of water were mixed in a 100 mL flask equipped with a stirrer and a thermometer, followed by reacting the components set forth above at 100° C. for 6 hours with stirring thereof (see the following reaction formula), and after the completion of the reaction, the reaction mixture underwent fractional extraction in 100 mL of hexane, thereby concentrating a hexane layer under reduced pressure. The resulting concentrate underwent reduced-pressure distillation (110° C., 4 kPa), thereby obtaining 3.0 g of N,N-dimethylamino-N'-hexylethylenediamine. (yield: 42%)

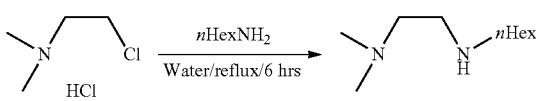

1.00 g (3.89 mmol) of bis(acetylacetonato)cobalt, 30 mL of methylene chloride, and 0.84 g (3.89 mmol) of dimethylhexylethylenediamine were mixed in a 100 ml-internal-volume flask equipped with a stirrer, a thermometer, and a dropping funnel. Next, the components set forth above were stirred at room temperature for 3 hours. After the completion of the reaction, the reaction solution was concentrated, followed by performing reduced-pressure distillation (oil bath temperature: 130° C., 133.3 Pa) on the concentrate, thereby obtaining 1.60 g of bis(acetylacetonato)cobaltdimethyl(hexyl)ethylenediamine as a reddish brown liquid. (yield: 92%)

Bis(acetylacetonato)cobaltdimethyl(hexyl)ethylenediamine was a novel compound exhibiting the following material properties.

Element analysis: Calcd: H, 8.9; C, 55.9; N, 6.5 Found: H, 8.6; C, 55.4; N, 6.8.

TG residue: <1 wt %, T1/2: 231

Synthesis Example 3

Synthesis of bis(trifluoroacetylacetonato)cobalt(N,N-dimethyl-N'-hexylethylenediamine)

Bis(trifluoroacetylacetonato)cobalt(N,N-dimethyl-N'-hexylethylenediamine) represented by Chemical Formula (11) was synthesized as follows.

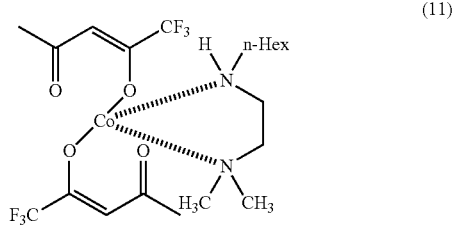

(11)

1.5 g (16.1 mmol) of cobalt hydroxide, 30 mL of methylene chloride, 4.97 g (32.3 mmol) of trifluoroacetylacetone, and 2.99 g (16.1 mmol) of N,N-dimethyl-N'-hexylethylenediamine were mixed in a 50 mL flask equipped with a stirrer, a thermometer, and a dropping funnel. Next, when the reaction was completed by stirring the components set forth above at room temperature for 4 hours, the reaction solution was filtered, followed by concentrating the filtered solution, and then the concentrate underwent reduced-pressure distillation (oil bath temperature: 130° C., 133.3 Pa), thereby obtaining 8.6 g of bis(trifluoroacetylacetonato)cobalt(N,N-dimethyl-N'-hexylethylenediamine) as a reddish brown liquid. (yield: 99%)

Bis(trifluoroacetylacetonato)cobalt(N,N-dimethyl-N'-hexylethylenediamine) was a compound exhibiting the following material properties.

Element analysis: Calcd: H, 6.0; C, 44.7; N, 5.2 Found: H, 6.2; C, 45.1; N, 5.2.

TG residue: <1 wt %, T 1/2: 227

Comparative Synthesis Example 1

Synthesis of (tert-butylacetylene)dicobalt hexacarbonyl (CCTBA)

In an argon atmosphere, 25.0 g (73.1 mmol) of dicobalt octacarbonyl and 200 ml of diethyl ether were mixed and stirred for 1 hour in a 500 ml-internal-volume flask equipped with a stirrer, a thermometer, and a dropping funnel. Next, while 6.61 g (80.4 mmol) of tert-butylacetylene was slowly dripped into the flask and stirred, a reaction was performed at 20° C. for 3 hours.

After the completion of the reaction, the reaction solution was concentrated under reduced pressure, followed by performing distillation of the concentrate under re-reduced pressure (70° C., 13.3 Pa), thereby obtaining 19.12 g of (tert-butylacetylene)dicobalt hexacarbonyl as a dark red liquid. (yield: 71%)

Material properties of obtained (tert-butylacetylene)dicobalt hexacarbonyl were as follows.

$^1$H-NMR ($C_6D_6$, δ(ppm)); 1.06 (9H, s), 5.45 (1H, s)

TG residue: 8 wt %, T1/2: 155

Comparative Synthesis Example 2

Synthesis of cyclopentadienylcobalt bis(carbonyl) ($CPCo(CO)_2$)

In an argon atmosphere, 2.0 g (5.8 mmol) of dicobalt octacarbonyl and 20 ml of benzene were mixed and stirred for 1 hour in a 50 ml-internal-volume flask equipped with a stirrer, a thermometer, and a dropping funnel. Next, 2.0 g (30.3 mmol) of cyclopentadiene was slowly injected into the flask, followed by performing a reaction at 75° C. for 3 hours with stirring.

After the completion of the reaction, the reaction solution underwent distillation under reduced pressure (70° C., 2.7 kPa), thereby obtaining 1.6 g of cyclopentadienylcobalt bis(carbonyl) as a dark red liquid. (yield: 76%)

Material properties of cyclopentadienylcobalt bis(carbonyl) were as follows.

$^1$H-NMR ($C_6D_6$, δ(ppm)); 5.06 (4H, s)

TG residue: <1 wt %, T1/2: 108

Film-Forming Example 1

A silicon oxide layer was formed on a silicon substrate, and a copper wiring line was formed in the silicon oxide layer in a damascene manner. Next, surfaces of the copper wiring line and the silicon oxide layer were pre-treated by using a hydrofluoric acid solution diluted to 1%.

Next, a cobalt metal layer was formed on the copper wiring line by a CVD process under the following conditions by using the cobalt compound of Synthesis Example 1.

Cobalt compound vaporization temperature: 60° C.
Ar carrier gas flow rate: 10 mL/min
Hydrogen flow rate: 500 mL/min
Pressure internal to reaction chamber: 1.3 kPa
Substrate temperature: 175° C.
Film-forming time: 3 minutes Film-Forming Examples 2 to 4

The selective formation of cobalt metal layers was performed in the same manner as in Film-forming Example 1 except that the substrate temperatures were respectively changed to 200° C., 250° C., and 300° C. for Film-forming Examples 2 to 4.

Film-Forming Example 5

After a substrate was prepared and pre-treated as in Film-forming Example 1, a cobalt metal layer was selectively formed on a copper wiring line by a CVD process under the following conditions by using the cobalt compound of Synthesis Example 1.
Cobalt compound vaporization temperature: 90° C.
Ar carrier gas flow rate: 10 mL/min
Hydrogen flow rate: 500 mL/min
Internal pressure of reaction system: 4 kPa
Substrate temperature: 200° C.
Film-forming time: 60 minutes Film-Forming Examples 6 to 8

The selective formation of cobalt metal layers was performed in the same manner as in Film-forming Example 5 except that the substrate temperatures were respectively changed to 175° C., 250° C., and 250° C. for Film-forming Examples 6 to 8 and that the film-forming times were respectively changed to 180 minutes, 120 minutes, and 180 minutes for Film-forming Examples 6 to 8.

Film-Forming Example 9

After a substrate was prepared and pre-treated as in Film-forming Example 1, a cobalt metal layer was selectively formed on a copper wiring line by a CVD process under the following conditions by using the cobalt compound of Synthesis Example 2.
Cobalt compound vaporization temperature: 115° C.
Ar carrier gas flow rate: 10 mL/min
Hydrogen flow rate: 500 mL/min
Internal pressure of reaction system: 1.3 kPa
Substrate temperature: 200° C.
Film-forming time: 3 minutes Film-Forming Examples 10 and 11

The selective formation of cobalt metal layers was performed in the same manner as in Film-forming Example 9 except that the substrate temperatures were respectively changed to 300° C. and 200° C. for Film-forming Examples 10 and 11 and that the film-forming times were respectively changed to 3 minutes and 30 minutes for Film-forming Examples 10 and 11.

Film-Forming Example 12

After a substrate was prepared and pre-treated as in Film-forming Example 1, a cobalt metal layer was selectively formed on a copper wiring line by a CVD process under the following conditions by using the cobalt compound of Synthesis Example 3.
Cobalt compound vaporization temperature: 110° C.
Ar carrier gas flow rate: 10 mL/min
Hydrogen flow rate: 500 mL/min
Internal pressure of reaction system: 1.5 kPa
Substrate temperature: 250° C.
Film-forming time: 20 minutes Comparative Film-Forming Example 1

After a substrate was prepared and pre-treated as in Film-forming Example 1, a cobalt metal layer was selectively formed on a copper wiring line by a CVD process under the following conditions by using the cobalt compound of Comparative Synthesis Example 1.
Cobalt precursor vaporization temperature: 35° C.
Ar carrier gas flow rate: 10 mL/min
Hydrogen flow rate: 500 mL/min
Internal pressure of reaction system: 1.3 kPa
Substrate temperature: 175° C.
Film-forming time: 3 minutes Comparative Film-Forming Example 2

After a substrate was prepared and pre-treated as in Film-forming Example 1, a cobalt metal layer was selectively formed on a copper wiring line by a CVD process under the following conditions by using the cobalt compound of Comparative Synthesis Example 2.
Cobalt precursor vaporization temperature: 26° C.
Ar carrier gas flow rate: 5 mL/min
Hydrogen flow rate: 500 mL/min
Internal pressure of reaction system: 1.3 kPa
Substrate temperature: 200° C.
Film-forming time: 3 minutes Comparative Film-Forming Examples 3 to 5

Cobalt metal layers were formed in the same manner as in Comparative Film-forming Example 2 except that the substrate temperatures were respectively changed to 250° C., 250° C., and 300° C. for Comparative Film-forming Examples 3 to 5 and that the film-forming times were respectively changed to 3 minutes, 10 minutes, and 10 minutes for Comparative Film-forming Examples 3 to 5.

Analysis on Film-Forming Selectivity

For each film-forming example and each comparative film-forming example, the thickness of the cobalt metal layer, which was formed on each of the copper wiring line and a silicon oxide region on the substrate, was measured, and results are shown in Table 1. The thickness of the cobalt metal layer was measured by X-ray fluorescence (XRF) and transmission electron microscope (TEM).

TABLE 1

| | Co compound vaporization temperature (° C.) | Substrate temperature (° C.) | Film-forming time (minutes) | Co thickness on Cu wiring line (nm) | Co thickness on SiO$_2$ region (nm) | Selectivity |
|---|---|---|---|---|---|---|
| Film-forming Example 1 | 60 | 175 | 3 | 4.19 | 0 | — |
| Film-forming Example 2 | 60 | 200 | 3 | 4.97 | 0 | — |
| Film-forming Example 3 | 60 | 250 | 3 | 6.55 | 0 | — |

TABLE 1-continued

| | Co compound vaporization temperature (° C.) | Substrate temperature (° C.) | Film-forming time (minutes) | Co thickness on Cu wiring line (nm) | Co thickness on SiO$_2$ region (nm) | Selectivity |
|---|---|---|---|---|---|---|
| Film-forming Example 4 | 60 | 300 | 3 | 23.3 | 0 | — |
| Film-forming Example 5 | 90 | 200 | 60 | 59 | 0 | — |
| Film-forming Example 6 | 90 | 175 | 180 | 23.8 | 0 | — |
| Film-forming Example 7 | 90 | 250 | 120 | 148 | 0 | — |
| Film-forming Example 8 | 90 | 250 | 180 | 206 | 0 | — |
| Film-forming Example 9 | 115 | 200 | 3 | 11.8 | 0 | — |
| Film-forming Example 10 | 115 | 300 | 3 | 7.11 | 0 | — |
| Film-forming Example 11 | 115 | 200 | 30 | 109 | 0 | — |
| Film-forming Example 12 | 110 | 250 | 20 | 83 | 0 | — |
| Comparative Film-forming Example 1 | 35 | 175 | 3 | 93.3 | 99.9 | 0.9:1 |
| Comparative Film-forming Example 2 | 26 | 200 | 3 | 4.46 | 1.05 | 4.2:1 |
| Comparative Film-forming Example 3 | 26 | 250 | 3 | 4.46 | 2.53 | 1.8:1 |
| Comparative Film-forming Example 4 | 26 | 250 | 10 | 13 | 5.82 | 2.2:1 |
| Comparative Film-forming Example 5 | 26 | 300 | 10 | 19.8 | 24.5 | 0.8:1 |

As shown in Table 1, it could be seen that, when the cobalt metal layer was formed by using the cobalt compound according to an example embodiment, the cobalt metal layer could be selectively formed on the copper wiring line at significantly high selectivity. Thus, it was confirmed that, when the cobalt compound according to an example embodiment was used, the cobalt metal layer was not substantially formed on the silicon oxide region even though the CVD process was performed for an extremely long time period such as 60 minutes, 120 minutes, or 180 minutes. As shown in Film-forming Examples 4 to 8, while the cobalt metal layer was deposited to a thickness of tens of nanometers to hundreds of nanometers on the copper wiring line, the cobalt metal layer was not substantially formed on the silicon oxide region.

In particular, when the cobalt compound according to an example embodiment was used, the cobalt metal layer could be formed consistently at extremely high selectivity even under a wide range of deposition conditions, whereas it could be seen that, when the cobalt precursor according to the related art was used, the selective deposition was allowed only under limited deposition conditions and the selectivity was relatively low. In addition, when the cobalt precursor according to the related art was used, there occurred cases of reversals of the selectivity under some deposition conditions (Comparative Film-forming Examples 1 and 5).

Further, it was confirmed that, when the cobalt metal layer was formed by using the cobalt compound according to an example embodiment, the cobalt metal layer was not substantially formed on the silicon oxide region at least under the tried film-forming conditions and thus allowed considerable practicality to be secured.

Analysis of Film Component

For the cobalt metal layers formed in Film-forming Examples 5, 6, and 11 and Comparative Film-forming Examples 1 and 2, components constituting each of the cobalt metal layers were measured by X-ray photoelectron spectroscopy (XPS), and results are shown in Table 2.

TABLE 2

| | (in atom %) | | | |
|---|---|---|---|---|
| | C | O | Co | N |
| Film-forming Example 5 | 1.7 | 0 | 98.3 | 0 |
| Film-forming Example 6 | 0 | 1.3 | 98.7 | 0 |
| Film-forming Example 11 | 1.1 | 0.8 | 97.4 | 0.7 |
| Comparative Film-forming Example 1 | 3.6 | 0 | 96 | 0 |
| Comparative Film-forming Example 2 | 3.7 | 30.5 | 65.7 | 0 |

As shown in Table 2, it was confirmed that, when the cobalt metal layer was formed by using the cobalt compound according to an example embodiment, the cobalt metal layer could be formed at a high purity greater than 97 atom %. Further, it was confirmed that, because impurities such as carbon or oxygen were present in an extremely low amount, post-treatment such as annealing or plasma treatment was not needed.

By way of summation and review, with respect to preventing electromigration, it is possible to form barrier layers on side surfaces and bottom surfaces of wiring lines to prevent electromigration. Methods of forming metal-containing layers on top surfaces of wiring lines by plating have been considered. However, when metal layers are formed by plating, contamination may occur and additional post-treatment operations may result.

As described above, embodiments relate to a cobalt compound, which allows a cobalt metal layer to be selectively formed at high selectivity and requires no post-treatment, a method of selectively forming a cobalt metal layer by using the cobalt compound, and a method of fabricating a semiconductor device by using the cobalt compound.

Embodiments may provide a cobalt compound allowing a cobalt metal layer to be selectively formed at high selectivity.

Embodiments may provide a method of selectively forming a cobalt metal layer, the method allowing the cobalt metal layer to be selectively formed at high selectivity and requiring no post-treatment.

Embodiments may provide a method of fabricating a semiconductor device by using the cobalt compound according to an embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of selectively forming a cobalt metal layer, the method comprising:

supplying a cobalt compound represented by Chemical Formula (1) onto a substrate that includes a wiring line of a late transition metal and an isolation film adjacent thereto; and supplying a reducing gas to selectively form a cobalt metal layer on the wiring line,

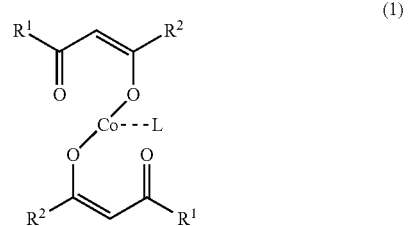

(1)

wherein, in Chemical Formula (1), L is a group represented by the following Chemical Formula:

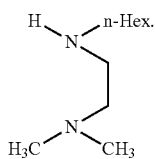

and $R^1$ and $R^2$ are each independently a C1 to C8 linear or branched alkyl group in which there is no substitution or wherein a hydrogen atom is substituted with a halogen atom.

2. The method as claimed in claim 1, wherein the late transition metal comprises at least one selected from the group of copper (Cu), cobalt (Co), platinum (Pt), palladium (Pd), rhodium (Rh), iridium (Ir), silver (Ag), gold (Au), ruthenium (Ru), and alloys thereof.

3. The method as claimed in claim 1, wherein a temperature of the substrate is about 80° C. to 500° C.

4. The method as claimed in claim 1, wherein the wiring line is on a layer that includes at least one film selected from the group consisting of a silicon nitride film, a silicon oxide film, a copper oxide film, a titanium nitride film, a titanium oxide film, a tantalum nitride film, a tantalum oxide film, a ruthenium oxide film, a zirconium oxide film, a hafnium oxide film, and a lanthanum oxide film.

5. The method as claimed in claim 1, wherein the cobalt metal layer includes carbon in an amount of about 3 wt % or less, and wherein the method further comprises using the cobalt metal layer without post-treating the cobalt metal layer by annealing or plasma treatment.

6. The method as claimed in claim 1, wherein a selectivity of the cobalt metal layer with respect to formation on the wiring line versus the isolation film is 60:1 or more.

7. The method as claimed in claim 6, wherein the cobalt metal layer is not substantially formed on the isolation film.

8. The method as claimed in claim 1, wherein, in Chemical Formula (1), $R^1$ and $R^2$ are each independently a methyl group, a monofluoromethyl group, a difluoromethyl group, a trifluoromethyl group, an ethyl group, a monofluoroethyl group, a difluoroethyl group, a trifluoroethyl group, or a tetrafluoroethyl group.

9. The method as claimed in claim 1, wherein the supplying of the cobalt compound at least partially overlaps the supplying of the reducing gas in terms of time.

10. The method as claimed in claim 1, wherein:

the supplying of the cobalt compound and the supplying of the reducing gas are sequentially performed, and the method further comprises, between the supplying of the cobalt compound and the supplying of the reducing gas, purging a space over the substrate.

11. A method of fabricating a semiconductor device, the method comprising:

providing a substrate that includes a wiring line of a late transition metal and an isolation film adjacent thereto;

supplying a cobalt compound represented by Chemical Formula (1) onto the substrate;

supplying a reducing gas to selectively form a cobalt metal layer on the wiring line; and forming an insulating layer on the cobalt metal layer,

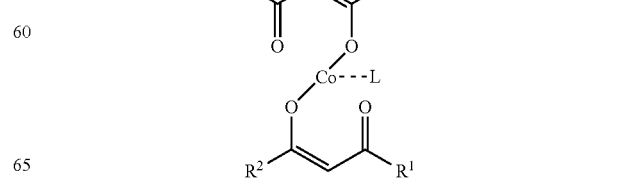

(1)

wherein, in Chemical Formula (1), L is represented by the following Chemical Formula:

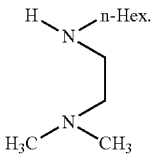

and $R^1$ and $R^2$ are each independently a C1 to C8 linear or branched alkyl group, in which there is no substitution, or wherein a hydrogen atom is substituted with a halogen atom.

12. The method as claimed in claim 11, wherein the cobalt metal layer is an electrical conductor.

13. The method as claimed in claim 11, wherein, in Chemical Formula (1), $R^1$ and $R^2$ are each independently a methyl group, a monofluoromethyl group, a difluoromethyl group, a trifluoromethyl group, an ethyl group, a monofluoroethyl group, a difluoroethyl group, a trifluoroethyl group, or a tetrafluoroethyl group.

14. A method of selectively forming a cobalt metal layer, the method comprising:
supplying a cobalt compound represented by Chemical Formula (1) onto a substrate that includes a copper wiring line and an isolation film adjacent thereto; and
supplying a reducing gas to selectively form a cobalt metal layer on the copper wiring line,

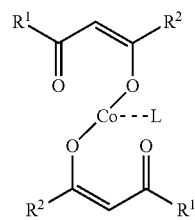

(1)

wherein, in Chemical Formula (1), $R^1$ and $R^2$ are each independently a methyl group or a trifluoromethyl group, and L is represented by the following Chemical Formula:

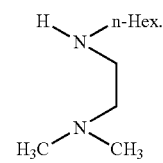

* * * * *